United States Patent
Tang

(10) Patent No.: US 9,972,363 B2
(45) Date of Patent: May 15, 2018

(54) APPARATUS FOR IMPEDANCE ADJUSTMENT AND METHODS OF THEIR OPERATION

(71) Applicant: MICRON TECHNOLOGY, INC., Boise, ID (US)

(72) Inventor: Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/444,980

(22) Filed: Feb. 28, 2017

(65) Prior Publication Data

US 2017/0169863 A1    Jun. 15, 2017

Related U.S. Application Data

(63) Continuation of application No. 14/639,375, filed on Mar. 5, 2015, now Pat. No. 9,621,160.

(51) Int. Cl.
| | |
|---|---|
| *G11C 5/14* | (2006.01) |
| *G06F 13/40* | (2006.01) |
| *H03K 19/00* | (2006.01) |
| *H03K 19/0175* | (2006.01) |

(52) U.S. Cl.
CPC ............ *G11C 5/14* (2013.01); *G06F 13/4072* (2013.01); *H03K 19/0005* (2013.01); *H03K 19/017545* (2013.01)

(58) Field of Classification Search
CPC ... G11C 5/14; G06F 13/4072; H03K 19/0005; H03K 19/017545
USPC .......................................................... 326/30
See application file for complete search history.

(56) References Cited

U.S. PATENT DOCUMENTS

| | | | |
|---|---|---|---|
| 7,535,250 B2 | 5/2009 | Batt | |
| 7,557,603 B2 | 7/2009 | Pan | |
| 7,626,416 B2 | 12/2009 | Kim | |
| 7,719,307 B2* | 5/2010 | Lee ................. | H03K 19/018521 |
| | | | 326/30 |
| 7,986,161 B2 | 7/2011 | Lee et al. | |
| 9,047,986 B2* | 6/2015 | Fujisawa ................ | G11C 29/02 |
| 2008/0001622 A1* | 1/2008 | You ..................... | H04L 25/0278 |
| | | | 326/30 |
| 2008/0048714 A1* | 2/2008 | Lee .................... | H03K 19/0005 |
| | | | 326/30 |

(Continued)

*Primary Examiner* — Dylan White
(74) *Attorney, Agent, or Firm* — Dicke, Billig & Czaja, PLLC

(57) ABSTRACT

Apparatus include a data bus and a signal driver circuit having pluralities of first and second termination devices connected in parallel between a voltage node and an output node. Each of the termination devices is configured to be deactivated in response to control signals having a particular set of logic levels, and to be activated in response to control signals having a set of logic levels other than the particular set of logic levels. Activated second termination devices each exhibit respective resistances greater than a particular resistance of each activated first termination device. Methods include connecting a node of an apparatus to a first voltage node through a reference resistance, connecting the node to a second voltage node through a termination device, and comparing a resulting voltage level to a reference voltage different than half-way between voltage levels of the first and second voltage nodes.

28 Claims, 10 Drawing Sheets

(56) References Cited

U.S. PATENT DOCUMENTS

| | | |
|---|---|---|
| 2008/0054937 A1* | 3/2008 | Kinoshita ............ G11C 7/1051 |
| | | 326/30 |
| 2009/0063789 A1 | 3/2009 | Greeff et al. |
| 2009/0146683 A1* | 6/2009 | Kim .................. H03K 19/0005 |
| | | 326/30 |
| 2009/0254925 A1 | 10/2009 | Ayyapureddi et al. |
| 2009/0289658 A1 | 11/2009 | Moon |
| 2011/0242916 A1 | 10/2011 | Seol et al. |
| 2012/0042148 A1 | 2/2012 | Grunzke |
| 2012/0092039 A1 | 4/2012 | Lee |
| 2012/0217992 A1* | 8/2012 | Fujisawa ................ G11C 29/02 |
| | | 326/30 |
| 2013/0015879 A1* | 1/2013 | Araki ............... H03K 19/00369 |
| | | 326/30 |
| 2014/0159769 A1 | 6/2014 | Hong et al. |
| 2016/0259385 A1* | 9/2016 | Tang ............. H03K 19/017545 |

\* cited by examiner

APPARATUS FOR IMPEDANCE ADJUSTMENT AND METHODS OF THEIR OPERATION

RELATED APPLICATIONS

This Application is a Continuation of U.S. patent application Ser. No. 14/639,375, titled "CIRCUITS FOR IMPEDANCE ADJUSTMENT HAVING MULTIPLE TERMINATION DEVICES WITH SWITCHABLE RESISTANCES AND METHODS OF ADJUSTING IMPEDANCE," filed Mar. 5, 2015, now U.S. Pat. No. 9,621,160, issued on Apr. 11, 2017, which is commonly assigned and incorporated herein by reference.

TECHNICAL FIELD

The present disclosure relates generally to integrated circuit devices and, in particular, in one or more embodiments, the present disclosure relates to adjusting impedance in an integrated circuit device, e.g., a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically uses a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

Electronic systems, such as memory systems, often include one or more types of memory and that memory is typically coupled to one or more communications buses within the memory system. Time varying signals in such systems are often utilized to transfer information (e.g., data) over one or more conductors often referred to as signal lines. These signal lines are often bundled together to form a communications channel, such as an address bus or a data bus, for example.

To meet the demands for higher performance operating characteristics, designers continue to strive for increasing operating speeds to transfer data across these communications buses within these systems. However, one issue with increased data transfer rates is maintaining signal integrity during these bursts of data on the various bus signal lines of the memory system. As these transfer rates increase, the impedance characteristics of a data bus become more pronounced. Capacitive and inductive characteristics of the signal lines may begin to distort the signal waveforms on the data bus at these higher data rates. Waveforms may begin to spread out and/or reflections may occur at locations of unmatched impedance on the data bus signal lines, for example. Signal integrity (e.g., data integrity) can be affected when an impedance (e.g., output impedance) of one or more nodes of a memory device coupled to a communications bus is not properly matched to the impedance of the communications bus. Impedance mismatch might result from process variations, temperature variations and voltage (e.g., power supply potential) variations in a memory device, for example. Thus, it is typically desirable to reduce these effects in order to reduce the likelihood of data corruption as data is transmitted on a data bus, for example.

Reducing the effects of impedance mismatch often involves the inclusion of adjustable termination devices within signal driver circuits, e.g., output driver circuits. These termination devices, often referred to as pull-up legs and pull-down legs, generally involve switchable resistances between a signal line and a voltage node, i.e., each termination device of a signal driver circuit can selectively connect the signal line to a voltage node through a resistance. For example, pull-up legs generally involve switchable resistances between a signal line and a supply voltage node, e.g., Vcc, while pull-down legs generally involve switchable resistances between the signal line and a reference voltage node, e.g., Vss.

A signal driver circuit may include multiple termination devices, and the resistance of each termination device is often adjustable. For example, the resistance may take the form of multiple resistors selectively connected in parallel between the signal line and the voltage node. By altering which resistors are connected, e.g., through the use of trim settings, the resistance of the termination device can be adjusted.

The resistance of a termination device is often calibrated to match (or closely match) a reference resistance in order to achieve a desired impedance. Because termination devices of a signal driver circuit often use the same configuration of resistors, and because process variation between devices during fabrication would be expected to be minimal within a signal driver circuit, settings determined for one termination device of a signal driver circuit are often copied to other termination devices. However, situations may arise where a desired impedance may not be achieved when adjusted in this manner.

For the reasons stated above, and for other reasons stated below which will become apparent to those skilled in the art upon reading and understanding the present specification, there is a need in the art for alternative apparatus for, and methods for, adjusting impedance in a signal driver circuit.

DETAILED DESCRIPTION

Figure 1:
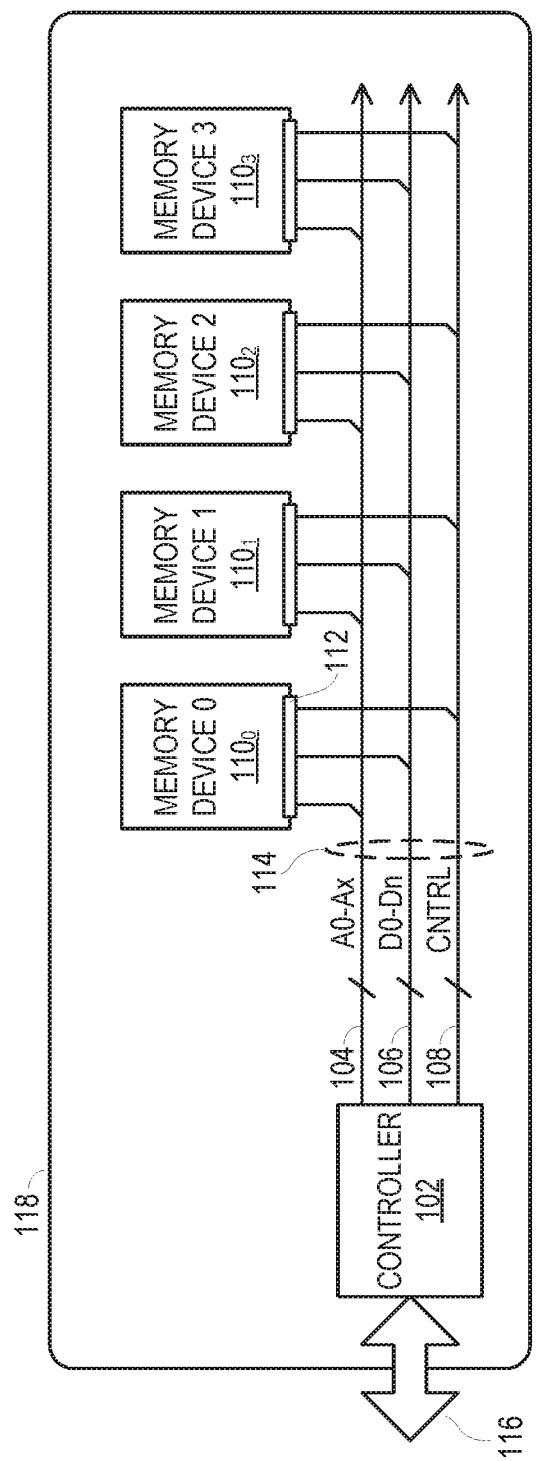
FIG. 1 shows a functional block diagram of an electronic system having at least one integrated circuit device coupled to a communications bus in accordance with an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 shows a functional block diagram of an electronic system (e.g., memory system) 118 having at least one integrated circuit device, such as memory devices $110_0$-$110_3$, coupled to a communications bus 114 (e.g., system bus) in accordance with an embodiment. Each memory device 110 might include one or more memory die (not shown.) Memory devices 110 comprising multiple die are sometimes referred to as a Multi-Chip Package (MCP), for example. One or more of the memory devices 110 may be in accordance with one or more embodiments herein.

A controller 102, such as a processor or other type of controlling circuitry might be coupled to the communications bus 114. Controller 102 regulates various operations within the memory system 118 as well as providing interactivity with another device or system coupled to the interface 116, for example.

The communications bus 114 might include one or more communications channels, such as an address bus A0-Ax 104, data bus D0-Dn 106 and a control signal bus CNTRL 108. Each of the address bus, data bus and control signal bus might include one or more signal lines. Individual control signals of control signal bus 108 are not shown to improve readability of the figure. Control signal bus 108 might carry control signals such as Address Latch Enable (ALE), Command Latch Enable (CLE), data strobe (DQS) and a clock signal (CLK), for example. Some communications buses utilize the same signal lines to transfer different types of information. For example, the address bus and data bus might transfer their respective signals on the same signal lines of the communications bus. The memory devices 110, communications bus 114 and controller 102 may collectively define an memory system 118 and might be configured (e.g., physically arranged and mounted) on a printed circuit board (PCB), for example.

A memory device 110 might be coupled to the communications bus 114 by an interface 112 (e.g., memory interface). Each memory interface 112 might include one or more nodes for coupling signal lines within (e.g., internal to) the memory device to respective signal lines of the communications bus. The nodes comprising a memory interface 112 might include input nodes and/or output nodes (e.g., I/O nodes), for example. Additional nodes of each memory interface 112 might include nodes to be coupled to one or more power supplies (not shown in FIG. 1), such as power and reference potentials, for example. A memory interface 112 might include an electromechanical type connection or might include soldered lead connections to the communications bus 114 of the memory system 118.

One method used to improve signal integrity, such as in high data rate applications, is to use what is referred to as On-Die Termination (ODT). ODT may be utilized by configuring each of the nodes of a memory interface 112 (e.g., data outputs) of a particular memory device 110 (e.g., die or package) coupled to the communications bus 114 to act (e.g., function) as a terminator (e.g., termination die) for one or more of the nodes of memory interface 112 coupled to the communications bus. For example, for a particular die to act as a termination die (e.g., a terminating memory device), driver circuitry including pull-up and pull-down termination devices configured as a voltage divider might be coupled to each output node of a memory device acting as a termination die. Thus, the output nodes of the termination die might be configured to act as terminators for the bus to which they are coupled.

Figure 2:
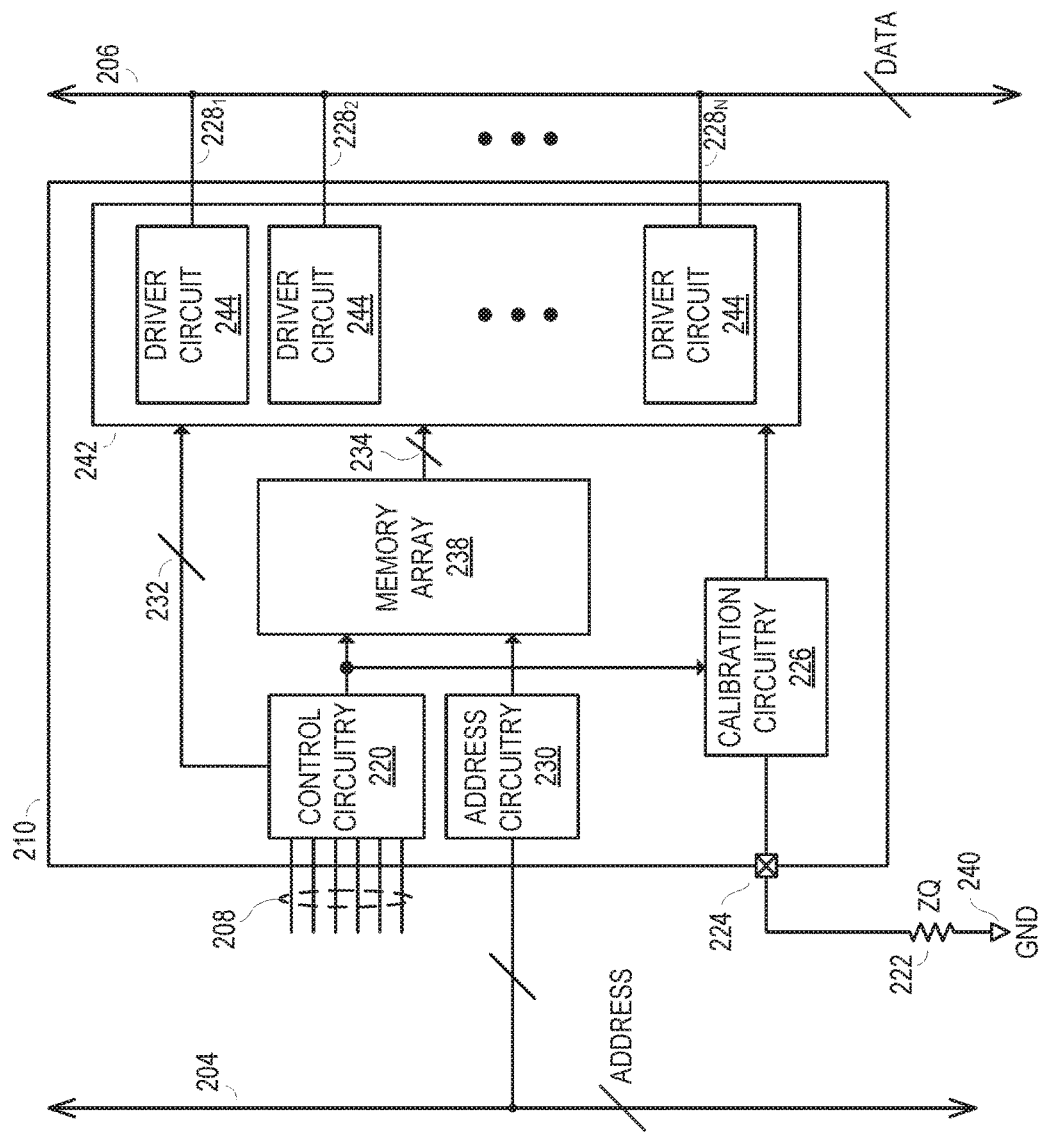
FIG. 2 shows a functional block diagram of a memory as could be used in an electronic system of the type shown in FIG. 1 according to an embodiment.

FIG. 2 shows a functional block diagram of a memory 210 as could be used in an electronic system (e.g., memory system) 118 of the type shown in FIG. 1 according to an embodiment. FIG. 2 illustrates the memory 210, such as one of the memory devices 110 shown in FIG. 1, coupled to an address bus 204, data bus 206 and control signal bus 208. The address bus 204, data bus 206 and control signal bus 208 might be combined, at least in part, to define a communications bus such as described above with respect to FIG. 1, for example. Control signal bus 208 shown coupled to memory 210 might include both memory device specific control signals and control signals commonly coupled to multiple memory devices. Memory 210 may be in accordance with one or more embodiments herein.

Memory 210 includes address circuitry 230 which is coupled the address bus 204 in order to receive addressing information from a controller (e.g., external controller) in order to access the memory array 238 of the memory 210. Memory 210 further includes control circuitry 220 which is coupled to control signal bus 208 and is configured to manage operations within the memory 210, such as verify, read, write and erase operations to be performed on the memory array 238, for example. Control circuitry 220 is also configured to manage operations within the driver (e.g., output driver) circuitry 242 by communicating various control signals over one or more signal lines 232. These operations might include placing the individual signal driver circuits (e.g., output driver circuits) 244, and thus the output nodes $228_1$-$228_N$, in a driving mode or termination mode, for example. The signal driver circuits 244 of the driver circuitry 242 might be placed in a driving mode when the memory 210 is selected to drive the data bus 206 to a particular state, such as in response to performing a read operation in the memory 210, for example. The memory array 238 might communicate data to the signal driver circuits 244 by one or more signal lines 234, for example.

Memory 210 might also be placed in a termination mode. In termination mode, the individual signal driver circuits 244 couple (e.g., switch in) a number of pull-up and/or pull-down termination devices (not shown in FIG. 2) to one or more (e.g., all) of the output nodes $228_1$-$228_N$ of the memory 210. These termination devices are switched in and out responsive to one or more control signals provided by control circuitry 220 across control signal lines 232, providing varying levels of termination strength (e.g., impedance).

A calibration operation, sometimes referred to as ZQ calibration, might be performed on a memory 210 so as to adjust resistance values of the pull-up and/or pull-down termination devices of the signal driver circuits 244 to adjust the impedance (e.g., output impedance) of the output nodes 228, for example. Calibration operations might be facilitated by reference to a reference resistance 222 (e.g., sometimes referred to as a ZQ resistor) coupled to a node (e.g., external terminal) 224 of the memory 210. ZQ resistor 222 might be further coupled to a voltage node 240 to receive a reference voltage, such as Vss or a ground potential. The ZQ resistor 222 and voltage node 240 may be external to the memory 210, e.g., connected during testing of the memory 210 following fabrication.

Calibration circuitry 226 of the memory 210 might be configured to facilitate performing output driver calibration operations, and selectively activating termination devices or switchable resistances of termination devices, in the memory 210 in accordance with various embodiments. Control circuitry 220 might be configured to provide one or more control signals to the calibration circuitry 226, such as to initiate calibrations operations and/or to indicate which termination devices should be activated. Alternatively, the calibration circuitry 226 may be a function of the control circuitry 220. The calibration circuitry 226 may be coupled to a particular signal driver circuit 244 which might be representative of the remaining signal driver circuits 244 of the driver circuitry 242. Control circuitry 220 and/or calibration circuitry 226 can independently or together (or in combination with other circuitry, firmware, and/or software) be considered a controller (e.g., internal controller) of the memory 210.

It will be appreciated by those skilled in the art that additional circuitry and signals can be provided, and that the memory 210 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Figure 3:
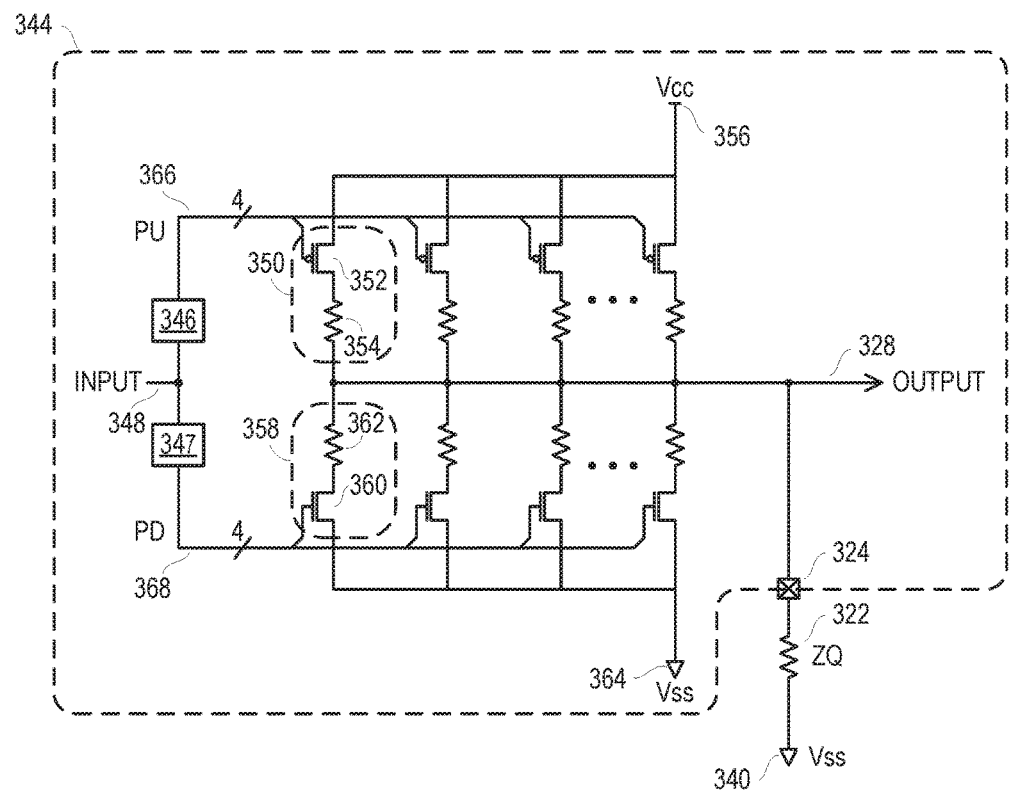
FIG. 3 illustrates a schematic representation of a signal driver circuit according to an embodiment.

FIG. 3 illustrates a schematic representation of a signal driver circuit 344 according to an embodiment. The signal driver circuit 344 may represent a signal driver circuit 244 shown in FIG. 2. Signal driver circuit (e.g., output driver circuit) 344 includes logic 346 and logic 347 which are configured to drive the output node (e.g., output signal line) 328 responsive, at least in part, to a logic level of data received at an input 348 from the memory array, such as in response to a read operation, over a particular signal line of the signal lines 234 coupling the memory array to the driver circuitry, or to present a particular impedance (e.g., calibrated or high Z) at the output node 328. The output node 328 might be one of the plurality of output nodes 228 coupled to the data bus 206 shown in FIG. 2, for example.

Signal driver circuit 344 also includes a plurality of termination devices (e.g., pull-up termination devices 350), each containing a switchable resistance, such as a switch (e.g., a transistor) 352 and a resistance (e.g., a resistor) 354 shown coupled between the output node 328 and a voltage node 356. The voltage node 356 might be coupled to receive a positive voltage, such as a supply potential Vcc. However, the voltage node 356 might be coupled to receive other voltage sources. The control gates of each transistor 352 of the pull-up termination devices 350 may be coupled by signal lines 366 to receive control signals generated by the control circuitry 220 and/or the calibration circuitry 226, for example. Signal lines 366 of the example of FIG. 3 might include four discrete signal lines, one signal line coupled to a control gate of each of the four transistors 352, e.g., in a one-to-one relationship. Signal lines 366 are shown as a single bus to improve readability of the figure. In addition, while pull-up termination devices 350 of FIG. 3 are depicted to include a single transistor 352 and a single resistor 354, pull-up termination devices 350 may include additional transistors and resistors to permit additional adjustment of the resistance presented by any individual pull-up termination device 350. An example of such a configuration will be discussed with reference to FIG. 4A.

Signal driver circuit 344 also includes another plurality of termination devices (e.g., pull-down termination devices 358), each containing a switchable resistance, such as a switch (e.g., a transistor) 360 and a resistance (e.g., a resistor) 362 shown coupled between the output node 328 and a voltage node 364. The voltage node 364 might be coupled to receive a reference potential, such as a ground potential Vss. In general, however, the voltage node 356 is coupled to receive a voltage level that is higher than the voltage level the voltage node 364 is coupled to receive. Similar to the transistors 352 of the pull-up termination devices 350, the control gates of each transistor 360 of the pull-down termination devices 358 may be coupled by signal lines 368 to receive control signals generated by the control circuitry 220 and/or the calibration circuitry 226, for example. Signal lines 368 of the example of FIG. 3 might include four discrete signal lines, one signal line coupled to a control gate of each of the four transistors 360, e.g., in a one-to-one relationship. Signal lines 368 are also shown as a single bus to improve readability of the figure. In addition, while pull-down termination devices 358 of FIG. 3 are depicted to include a single transistor 360 and a single resistor 362, pull-down termination devices 358 may include additional transistors and resistors to permit adjustment of the resistance presented by any individual pull-down termination device 358. An example of such a configuration will be discussed with reference to FIG. 4B. Groups of termination devices, such as the plurality of pull-up termination devices 350 or the plurality of pull-down termination devices 358, are sometimes referred to as unit drivers. Pull-up unit drivers might include different numbers of termination devices than pull-down unit drivers.

The configuration of signal driver circuit 344 shown in FIG. 3 allows for the control circuitry 220 and/or calibration circuitry 226 to selectively activate various combinations of the pull-up termination devices 350 and/or pull-down termination devices 358 of a signal driver circuit 344, such as while the memory device is providing data output on output node 328, while the memory device is presenting high Z on output node 328 (e.g., during data input to the memory device if the output node 328 is physically shared with an input node), while the memory device is acting as a termination device, or while the memory device is performing a calibration operation. As an example, when the input 348 is at a logic high level, logic 346 and 347 might be configured to apply logic low signals to all signal lines 366 and all signal lines 368, thus providing a logic high level at the output node 328. Similarly, when the input 348 is at a logic low level, logic 346 and 347 might be configured to apply logic high signals to all signal lines 366 and all signal lines 368, thus providing a logic low level at the output node 328. When the memory device seeks to provide a high Z at the output node 328, logic 346 might be configured to apply logic high signals to all signal lines 366 and to apply logic low signals to all signal lines 368. And when the memory device seeks to act as a termination device, logic 346 and 347 might be configured to selectively activate their respective pull-up and pull-down termination devices 350 and 358 according to settings (e.g., calibration settings) determined in response to a ZQ calibration.

Each pull-up termination device 350 and/or each pull-down termination device 358 might be configured to exhibit a same termination resistance when activated. Signal driver circuit 344 might have different numbers of pull-up termination devices 350 and/or pull-down termination devices 358 than are pictured in FIG. 3 and might, for example, include many more termination devices 350/358 than those shown in FIG. 3.

The control circuitry 220 and/or calibration circuitry 226 might also selectively adjust the termination devices (e.g., activate one or more pull-up termination devices 350 and/or pull-down termination devices 358) in the signal driver circuit 344 in response to configuration information, e.g., a stored termination value associated with a particular driver circuit.

FIG. 3 further illustrates a reference resistance (e.g., ZQ resistor) 322, such as reference resistance (e.g., ZQ resistor) 222 shown in FIG. 2, coupled between a voltage node 340 and the output node 328. The voltage node 340 might be coupled to receive the same reference potential as voltage node 364.

Figure 4A:
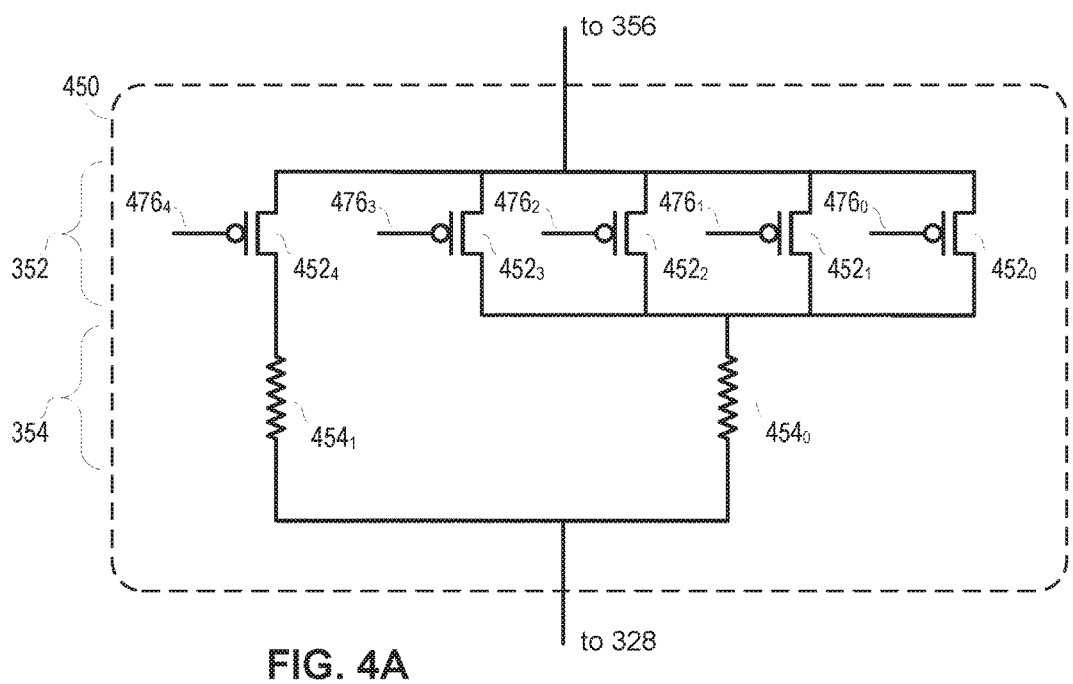
FIGS. 4A-4B are schematics of termination devices according to embodiments.

To provide additional degrees of freedom in adjusting the resistance of a unit driver, individual termination devices may include a configuration of more than one switchable resistance. FIG. 4A is a schematic of a pull-up termination device 450, such as an alternate configuration of switchable resistances of a pull-up termination device 350 of FIG. 3. The pull-up termination device 450 is depicted to include a plurality of switches (e.g., transistors) 452 (e.g., pFET transistors $452_0$-$452_4$) and a plurality of resistances (e.g., resistors) 454 (e.g., resistors $454_0$-$454_1$). The control gates of each transistor 452 of the pull-up termination device 450 may be coupled to individual signal lines 476 (e.g., signal lines $476_0$-$476_4$), which may form a portion of signal lines 366, to receive control signals to selectively activate the transistors 452 independent of each other. Where each pull-up termination device 350 of FIG. 3 has the configuration of the pull-up termination device 450, signal lines 366 of the example of FIG. 3 might include twenty discrete signal lines, one signal line 476 coupled to a control gate of each of the five transistors 452 and for each of the four pull-up termination devices 350, e.g., in a one-to-one relationship. Although each pull-up termination device 350 might be connected to its own set of signal lines of signal lines 366 to allow selective activation (i.e., activation of one or more of its transistors 352/452) or deactivation (i.e., deactivation of all of its transistors 352/452), each activated pull-up termination device 350 might receive the same set of control signals on its corresponding set of signal lines (e.g., signal lines 476).

The transistors 452 may have different channel widths with substantially the same channel length, thus providing different resistance values for the transistors 452. As an example, the transistor $452_1$ may have a channel width of two times the channel width of transistor $452_0$, the transistor $452_2$ may have a channel width of four times the channel width of transistor $452_0$, the transistor $452_3$ may have a channel width of eight times the channel width of transistor $452_0$, and the transistor $452_4$ may have a channel width of eight times the channel width of transistor $452_0$. Typical resistance values of resistors $454_0$ and $454_1$ might be 140 Ohms and 260 Ohms, respectively. In such a configuration, a variety of resistance values can be generated for the pull-up termination device 450 by selectively activating various combinations of the transistors 452. Note that the configuration of switchable resistances depicted in FIG. 4A is just one example, and other configurations of switchable resistances can be used for a pull-up termination device used with embodiments described herein, which are not restricted to any particular configuration.

Figure 4B:
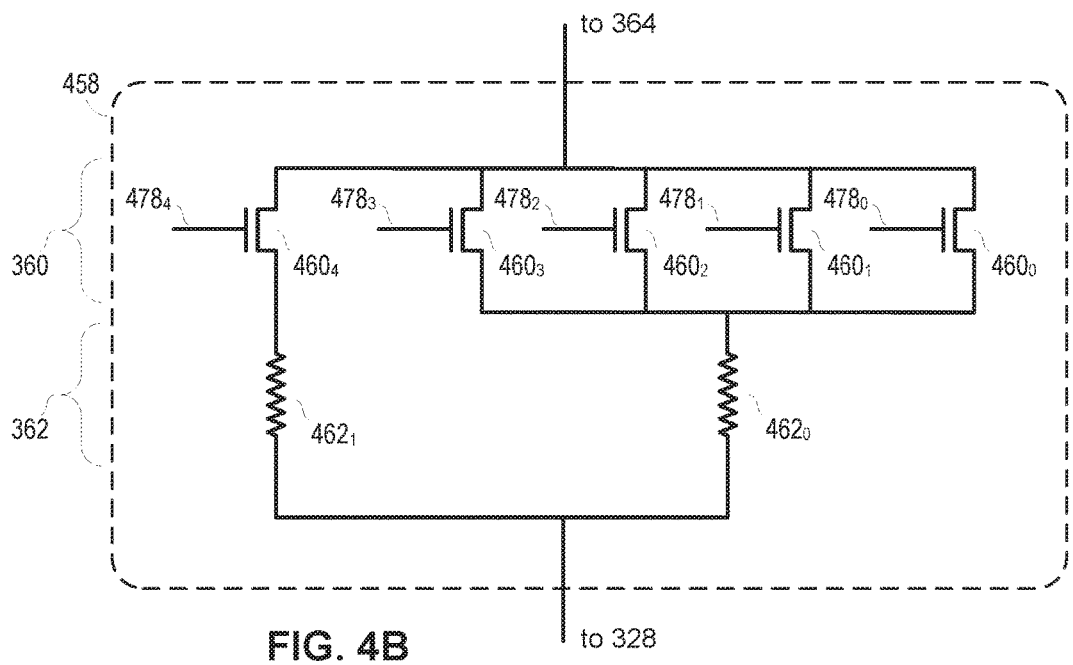

FIG. 4B is a schematic of a pull-down termination device 458, such as an alternate configuration of switchable resistances of a pull-down termination device 358 of FIG. 3. The configuration of the pull-down termination device 458 may mirror the configuration of the pull-up termination device 450. As such, the pull-down termination device 458 is depicted to include a plurality of switches (e.g., transistors) 460 (e.g., nFET transistors $460_0$-$460_4$) and a plurality of resistances (e.g., resistors) 462 (e.g., resistors $462_0$-$462_1$). The control gates of each transistor 460 of the pull-down termination device 458 may be coupled to individual signal lines 478 (e.g., signal lines $478_0$-$478_4$), which may form a portion of signal lines 368, to receive control signals to selectively activate the transistors 460 independent of each other. Where each pull-down termination device 358 of FIG. 3 has the configuration of the pull-down termination device 458, signal lines 368 of the example of FIG. 3 might include twenty discrete signal lines, one signal line 478 coupled to a control gate of each of the five transistors 460 and for each of the four pull-down termination devices 358, e.g., in a one-to-one relationship. Although each pull-down termination device 358 might be connected to its own set of signal lines of signal lines 368 to allow selective activation (i.e., activation of one or more of its transistors 360/460) or deactivation (i.e., deactivation of all of its transistors 360/460), each activated pull-down termination device 358 might receive the same set of control signals on its corresponding set of signal lines (e.g., signal lines 478).

The transistors 460 may have different channel widths with substantially the same channel length, thus providing different resistance values for the transistors 460. As an example, the transistor $460_1$ may have a channel width of two times the channel width of transistor $460_0$, the transistor $460_2$ may have a channel width of four times the channel width of transistor $460_0$, the transistor $460_3$ may have a channel width of eight times the channel width of transistor $460_0$, and the transistor $460_4$ may have a channel width of eight times the channel width of transistor $460_0$. Typical resistance values of resistors $462_0$ and $462_1$ might be 140 Ohms and 260 Ohms, respectively. In such a configuration, a variety of resistance values can be generated for the pull-down termination device 458 by selectively activating various combinations of the transistors 460. Note that the configuration of switchable resistances depicted in FIG. 4B is just one example, and other configurations of switchable resistances can be used for a pull-down termination device used with embodiments described herein, which are not restricted to any particular combination of parallel and/or serially connected switchable resistances.

Figure 5:
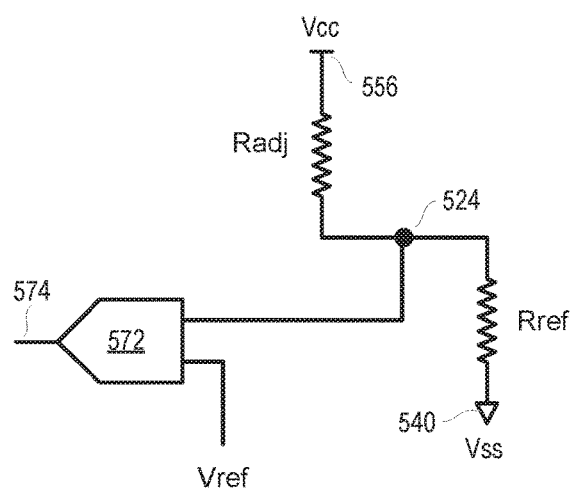
FIG. 5 is a simplified schematic for use in describing impedance adjustment for use with various embodiments.

FIG. 5 is a simplified schematic for use in describing impedance adjustment for use with various embodiments. FIG. 5 depicts an adjustable resistance Radj and a reference resistance Rref connected in series between a voltage node 556 and a voltage node 540, and may model the signal driver circuit 344 with regard to its calibration. For example, the reference resistance Rref may represent the ZQ resistor 322, the node 524 may represent the node 324, the voltage node 556 may represent the voltage node 356, and the voltage node 540 may represent the voltage node 340. The adjustable resistance Radj may represent the adjustable resistance of one or more of its pull-up termination devices 350. The calibration may include selectively activating one or more of the pull-up termination devices 350 of the pull-up unit driver seeking to match the reference resistance Rref, or the calibration may include adjusting a resistance of an individual pull-up termination device 350. While the pull-down termination devices 358 may be individually calibrated as well, with appropriate changes to the voltage of the voltage node 540 (e.g., coupled to receive Vcc instead of Vss), their settings are often just copied from the calibration settings of one of the pull-up termination devices 350.

In calibration, when the node 524 is connected to the voltage node 540 through the reference resistance Rref, and the node 524 is connected to the voltage node 556 through the adjustable resistance Radj, a voltage on the node 524 will be one-half of the sum of the voltage levels of the voltage nodes 556 and 540 when the adjustable resistance Radj is adjusted to be equal to the reference resistance Rref. For example, where the voltage node 556 is coupled to receive Vcc and the voltage node 540 is coupled to receive Vss, the node 524 would be at Vcc/2 if the adjustable resistance Radj is adjusted to be equal to the reference resistance Rref.

By connecting the node 524 to one input of a voltage comparator 572 and connecting the other input of the voltage comparator 572 to receive a reference voltage Vref, a signal can be provided on output 574 indicative of whether the voltage level on node 524 is less than or greater than the reference voltage Vref. For example, the signal on output 574 may have a logic high level when the voltage level of node 524 is less than the reference voltage Vref, and a logic low level when the voltage level of node 524 is greater than the reference voltage Vref. As such, by setting the reference voltage Vref to Vcc/2, and incrementally adjusting the resistance Radj from a low value (e.g., its lowest adjustable value) to a high value (e.g., its highest adjustable value), the resistance Radj might be deemed to match the reference resistance Rref when the signal at the output 574 transitions from the logic low level to the logic high level. Alternately, the adjustable resistance Radj could be decrementally adjusted from a high value (e.g., its highest adjustable value) to a low value (e.g., its lowest adjustable value), and the resistance Radj might be deemed to match the reference resistance Rref when the signal at the output 574 transitions from the logic high level to the logic low level. In either case, the settings used for either the configuration before or after the signal transition might be deemed to provide a match to the reference resistance Rref.

For the calibration of a pull-up termination device 350 having a configuration of the pull-up termination device 450, the transistors 352 of all other pull-up termination devices 350 might be deactivated, and the transistors 360 of all pull-down termination devices 358 might be deactivated. The reference resistance Rref may again represent the ZQ resistor 322, the node 524 may again represent the node 324, the voltage node 556 may again represent the voltage node 356, and the voltage node 540 may again represent the voltage node 340. The adjustable resistance Radj may represent the adjustable resistance of the pull-up termination device 450 through its configuration of switchable resistances. The calibration may include selectively activating one or more of the transistors 452 seeking to match the reference resistance Rref similar to that described above.

Once a calibration of a pull-up termination device 350 is complete, the settings (i.e., calibration settings) deemed to provide a match to the reference resistance Rref might be used for each termination device of the signal driver circuit 344. Consider the example where the pull-up termination devices 350 each have the configuration of the pull-up termination device 450, and the pull-down termination devices 358 each have the configuration of the pull-down termination device 458. If the configuration settings of the pull-up termination device 450 deemed to match the reference resistance Rref included activation of transistors $452_4$, $452_2$ and $452_1$ (such as by applying a control signal having a logic low level to the corresponding signal lines $476_4$, $476_2$ and $476_1$), and deactivation of transistors $452_3$ and $452_0$ (such as by applying a control signal having a logic high level to the corresponding signal lines $476_3$ and $476_0$), each pull-up termination device 350 having the configuration of pull-up termination device 450 might have its transistors $452_4$, $452_2$ and $452_1$ activated, and its transistors $452_3$ and $452_0$ deactivated through similar application of control signals to their corresponding signal lines 476. Similarly, each pull-down termination device 358 having the configuration of pull-down termination device 458 might have its transistors $460_4$, $460_2$ and $460_1$ activated (such as by applying a control signal having a logic high level to the corresponding signal lines $478_4$, $478_2$ and $478_1$), and its transistors $460_3$ and $460_0$ deactivated (such as by applying a control signal having a logic low level to the corresponding signal line $478_3$ and $478_0$).

When calibrated in this manner, a unit driver might be capable of a termination or driver strength having a resistance value of Rref/N, where Rref is the reference resistance used for calibration, and N is the number of activated termination devices (e.g., like configured termination devices). However, it may be desirable to achieve a termination or driver strength having other resistance values. Various embodiments facilitate obtaining other resistance values using the same reference resistance.

Referring again to FIG. 5, if the reference voltage applied to one input of the comparator 572 is changed to a voltage level that is different than half-way between the voltage level of the voltage node 556 and the voltage level of the voltage node 540, e.g., greater than or less than Vcc/2 in the specific example, adjustable resistances Radj will have values less than or greater than, respectively, the reference resistance Rref. For example, where the voltage node 556 receives Vcc and the voltage node 540 receives Vss, and the reference voltage Vref has a value of Vcc/2+ΔV, the adjustable resistance Radj would have a value of Rref*(Vcc−2ΔV)/(Vcc+2ΔV). More generally, the adjustable resistance Radj could have a value of Rref*(Vhigh−Vlow−2ΔV)/(Vhigh−Vlow+2ΔV), where Vhigh is the voltage level of the voltage node 556 and Vlow is the voltage level of the voltage node 540. Thus, where ΔV is positive, resistance values less than the reference resistance Rref can be calibrated, and where ΔV is negative, resistance values greater than the reference resistance Rref can be calibrated, using the same reference resistance Rref. Thus, for a particular resistance value (e.g., desired resistance value) for a termination device, an appropriate value for the reference voltage Vref can be determined for a given reference resistance Rref from the foregoing equations.

Figure 6:
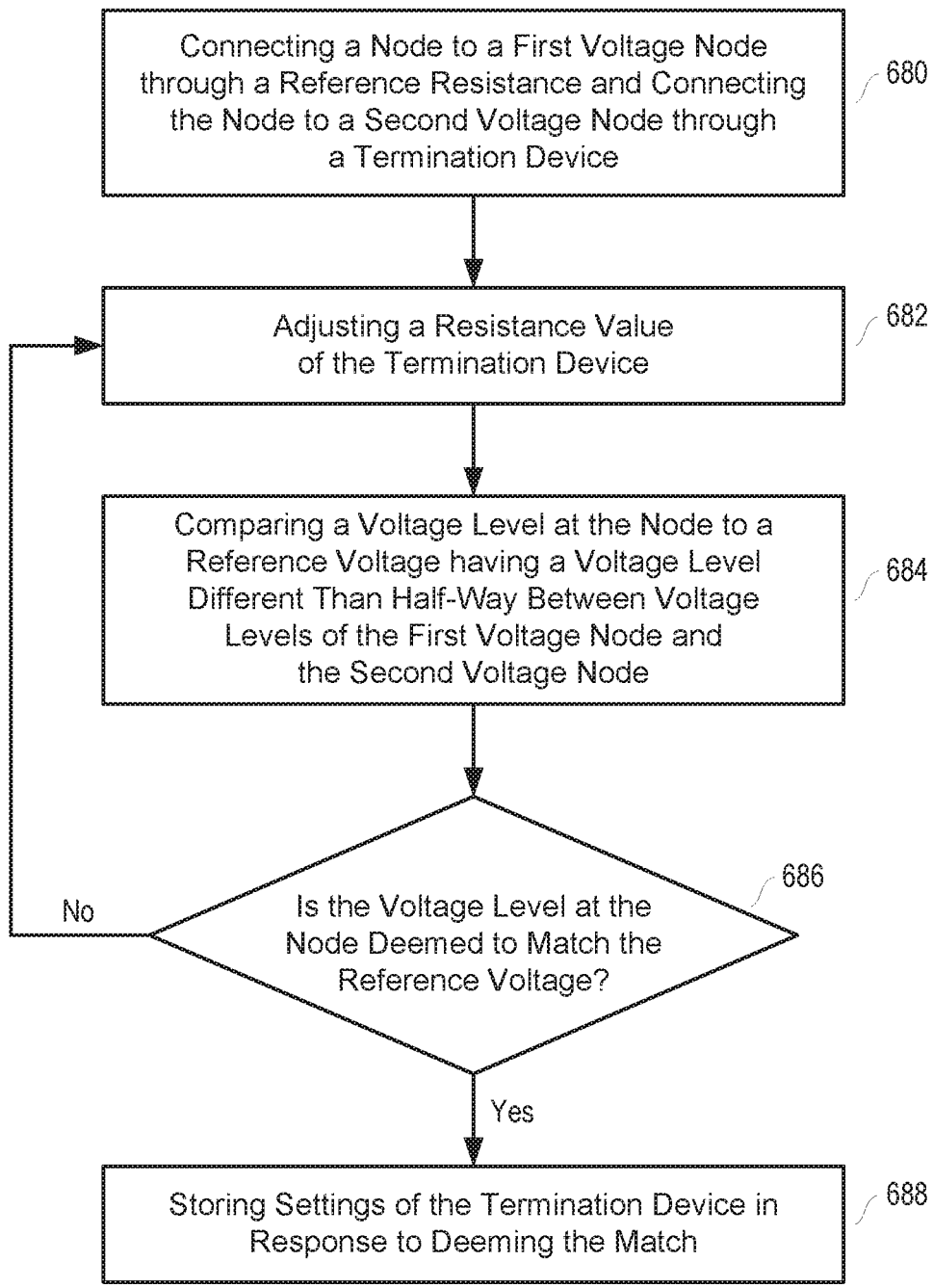
FIG. 6 is a flowchart of a method of operating an integrated circuit device according to an embodiment.

FIG. 6 is a flowchart of a method of operating an integrated circuit device. At 680, a node is connected to a first voltage node through a reference resistance and to a second voltage node through a termination device. For example, the node 324 of the signal driver circuit 344 could be connected to the voltage node 340 (e.g., the first voltage node) through a reference resistance 322, and to the voltage node 356 (e.g., the second voltage node) through one of the pull-up termination devices 350. The selected pull-up termination device 350 might have two or more switchable resistances as discussed with reference to FIG. 4A.

At 682, a resistance value of the termination device is adjusted. For example, the termination device may be calibrated as discussed with reference to FIG. 5. At 684, a voltage level at the node is compared to a reference voltage having a voltage level different than half-way between a voltage level of the first voltage node and a voltage level of the second voltage node. For example, the reference voltage might have a voltage level of (V1+V2)/2+ΔV, where V1 is the voltage level (e.g., nominal voltage level) of the first voltage node, V2 is the voltage level (e.g., nominal voltage level) of the second voltage node, and ΔV is some positive or negative voltage value. The absolute value of ΔV may exceed a variability of the voltages V1 and V2. For example, if V1 and V2 are expected to be controlled to within plus or minus 100 millivolts (i.e., their variability), the absolute value of ΔV may be selected to be a value greater than 100 millivolts.

If the voltage level at the node is deemed to match the reference voltage at 686, the method continues to 688, where settings of the termination device are stored in response to deeming the match. As discussed with reference to FIG. 5, the voltage level at the node might be deemed to match the reference voltage when an output signal of a voltage comparator transitions from one logic level to another. The settings chosen for storage might be the current settings (e.g., those settings producing the voltage level at the node that was deemed to match the reference voltage), or the settings chosen for storage might be those settings used prior to (e.g., immediately prior to) deeming the match. As noted above, the stored settings are generally used for other termination devices. However, the other termination devices might be individually calibrated using the same or different reference voltage. If the voltage level at the node is not deemed to match the reference voltage at 686, the method returns to 682 to further adjust the resistance value of the termination device.

For another embodiment, each of the termination devices of a unit driver might have the same configuration of switchable resistances. However, the unit driver might include a first group of termination devices (e.g., full-strength termination devices) and a second group of termination devices (e.g., partial-strength termination devices), where the termination devices of the second group might collectively perform as a single termination device of the first group. For example, when all termination devices of the second group are activated, they might collectively provide the same (e.g., substantially the same) resistance value as a single activated termination device of the first group.

Figure 7:
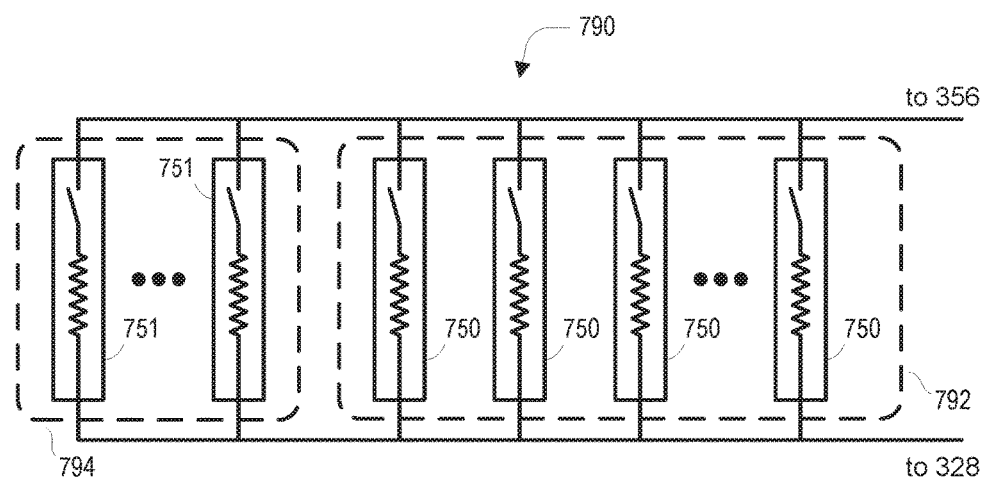
FIG. 7 is a simplified schematic of a unit driver (e.g., pull-up unit driver) 790 in accordance with an embodiment.

FIG. 7 is a simplified schematic of a unit driver (e.g., pull-up unit driver) 790 in accordance with an embodiment. Although the unit driver 790 is depicted to be a pull-up unit driver, the same concepts described with reference to FIG. 7 may be applied to a corresponding pull-down unit driver.

The pull-up unit driver 790 is depicted to include a first group of termination devices 792 including one or more pull-up termination devices 750 (e.g., full strength pull-up termination devices 750). The pull-up unit driver 790 is depicted to further include a second group of termination devices 794 including one or more pull-up termination devices 751 (e.g., partial strength pull-up termination devices 751). The pull-up termination devices 751 and the pull-up termination devices 750 may have the same configuration of switchable resistances, i.e., they may each have the same configuration of switches and resistances. The pull-up termination devices 751 of the second group of termination devices 794 may alter the size of the switches or resistance values of the resistances to collectively provide the same resistance value as one of the pull-up termination devices 750 of the first group of termination devices in response to a same set of control signals.

For example, the pull-up termination devices 751 and the pull-up termination devices 750 may both have the configuration of the pull-up termination device 450 of FIG. 4A. However, the channel widths of the transistors 452 of a pull-up termination device 751 may be some fraction (e.g., some common fraction) of the channel widths of the corresponding transistors 452 of a pull-up termination device 750, while the resistance values of the resistors 454 of the pull-up termination device 751 may be some multiple (e.g., some common multiple) of the resistance values of the corresponding resistor 454 of the pull-up termination device 750. Consider the example where the second group of pull-up termination devices has two pull-up termination devices 751. Table 1 illustrates a comparison of the channel widths of corresponding transistors 452 for one of the pull-up termination devices 751 and one of the pull-up termination devices 750 for the foregoing example, while Table 2 illustrates a similar comparison of resistance values of resistors 454.

TABLE 1

Channel Width Comparison

| Transistor 452 | Pull-Up Termination Device 750 | Pull-Up Termination Device 751 |
|---|---|---|
| Transistor $452_0$ | x | x/2 |
| Transistor $452_1$ | 2x | x |
| Transistor $452_2$ | 4x | 2x |
| Transistor $452_3$ | 8x | 4x |
| Transistor $452_4$ | y | y/2 |

Where x and y are any selected values for channel widths

TABLE 2

Resistance Value Comparison

| Resistor 454 | Pull-Up Termination Device 750 | Pull-Up Termination Device 751 |
|---|---|---|
| Resistor $454_0$ | $R_0$ | $2R_0$ |
| Resistor $454_1$ | $R_1$ | $2R_1$ |

Where $R_0$ and $R_1$ are any selected resistance values

In this manner, two pull-up termination devices 751 connected in parallel may collectively provide substantially the same (e.g., the same) resistance value as one pull-up termination device 750 when the same set of control signals are applied to their corresponding transistors 452. In general, where the second group of termination devices 794 contains N pull-up termination devices 751, the channel widths of the transistors providing for the switchable resistances may be 1/N the channel widths of their corresponding transistors of a pull-up termination device 750 of the first group of termination devices 792, while the resistance values of the resistors providing for the switchable resistances may be N times the resistance values of their corresponding resistors of the pull-up termination device 750 of the first group of termination devices 792. In this manner, N pull-up termination devices 751 (e.g., of 1/N strength) could collectively provide the same resistance value as a single pull-up termination device 750 in response to the same set of control signals. Although the example provides for N pull-up termination devices 751 collectively providing the same resistance value as a single pull-up termination device 750 in response to the same set of control signals, the second group of termination devices 794 might contain a number of pull-up termination devices 751 less than N pull-up termination devices 751. For example, the second group of termination devices 794 might contain N−1 pull-up termination devices 751

While pull-up termination devices 751 of the second group of pull-up termination devices might all utilize the same channel widths and resistance values, alternate embodiments may utilize different channel widths and resistance values such that the second group of pull-up termination devices 794 could collectively provide substantially the same (e.g., the same) resistance value of a single pull-up termination device 750. Consider the example where the second group of pull-up termination devices has two pull-up termination devices 751. One of the pull-up termination devices 751 might utilize channel widths of its transistors that are ⅓ the channel widths of the corresponding transistors of a pull-up termination device 750, and resistance values that are three times the resistance values of the corresponding resistors of the pull-up termination device 750. The other one of the pull-up termination devices 751 might utilize channel widths of its transistors that are ⅔ the channel widths of the corresponding transistors of a pull-up termination device 750, and resistance values that are 1.5 times the resistance values of the corresponding resistors of the pull-up termination device 750. Thus, the strength of the second one of the pull-up termination devices 751 is a multiple (i.e., two times in this example) the strength of the first one of the pull-up termination devices 751. In this manner, two pull-up termination devices 751 could provide the same degrees of freedom as three ⅓ strength pull-up termination devices through activation of one pull-up termination device 751 (e.g., ⅓ strength), activation of the other pull-up termination device 751 (e.g., ⅔ strength), or activation of both pull-up termination devices 751 (e.g., full strength).

Other embodiments may utilize different channel widths and resistance values such that the second group of pull-up termination devices 794 collectively provides some fraction of the resistance value of a single pull-up termination device 750. Consider the example where the second group of pull-up termination devices has two pull-up termination devices 751. One of the pull-up termination devices 751 might utilize channel widths of its transistors that are ¼ the channel widths of the corresponding transistors of a pull-up termination device 750, and resistance values that are four times the resistance values of the corresponding resistors of the pull-up termination device 750. The other one of the termination devices 751 might utilize channel widths of its transistors that are ½ the channel widths of the corresponding transistors of a pull-up termination device 750, and resistance values that are two times the resistance values of the corresponding resistors of the pull-up termination device 750. In this manner, two pull-up termination devices 751 could provide a ¼ strength pull-up termination device through activation of one pull-up termination device 751, could provide a ½ strength pull-up termination device through activation of the other pull-up termination device 751, or could provide a ¾ strength pull-up termination device through activation of both pull-up termination devices 751. If the resistance value of a full-strength pull-up termination device were desired during calibration, both pull-up termination devices 751 could be deactivated and an additional pull-up termination device 750 could be activated.

Figure 8A:
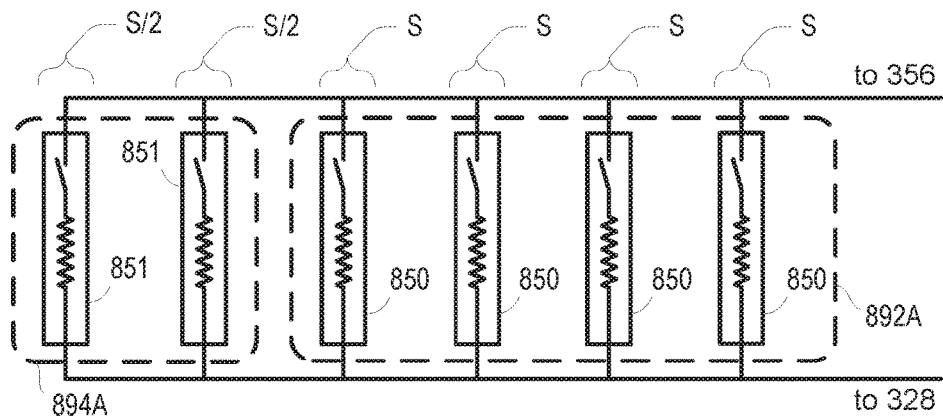
FIGS. 8A-8C are simplified schematics of unit drivers (e.g., pull-up unit drivers) in accordance with embodiments.

FIG. 8A is a simplified schematic of a unit driver (e.g., pull-up unit driver) 890A in accordance with an embodiment. Although the unit driver 890A is depicted to be a pull-up unit driver, the same concepts described with reference to FIG. 8A may be applied to a corresponding pull-down unit driver. The pull-up unit driver 890A is depicted to include a first group of termination devices 892A including one or more pull-up termination devices 850 (e.g., full strength pull-up termination devices 850) each having a strength of some value S. The pull-up unit driver 890A is depicted to further include a second group of termination devices 894A including one or more pull-up termination devices 851 (e.g., partial strength pull-up termination devices 851) each having a strength of one-half the value S. The pull-up termination devices 851 and the pull-up termination devices 850 may have the same configuration of switchable resistances, i.e., they may each have the same configuration of switches and resistances.

For example, the pull-up termination devices 851 and the pull-up termination devices 850 may both have the configuration of the pull-up termination device 450 of FIG. 4A. However, the channel widths of the transistors 452 of a pull-up termination device 851 may be some fraction (e.g., some common fraction) of the channel widths of the corresponding transistors 452 of a pull-up termination device 850, while the resistance values of the resistors 454 of the pull-up termination device 851 may be some multiple (e.g., some common multiple) of the resistance values of the corresponding resistor 454 of the pull-up termination device 850.

Figure 9A:
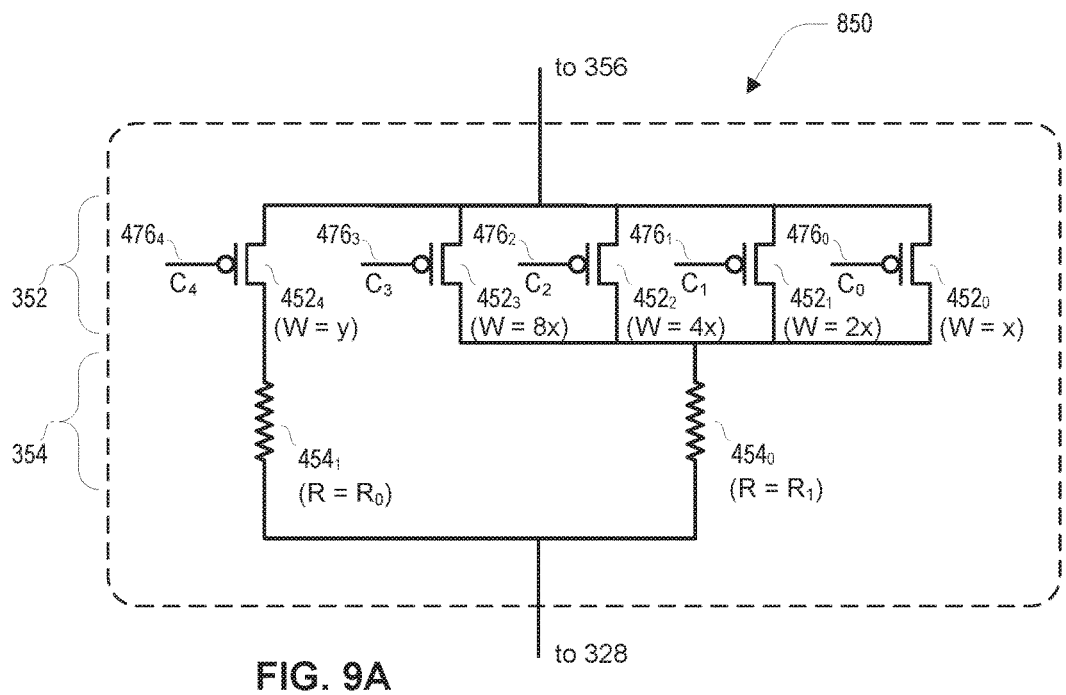
FIGS. 9A-9F are schematics of termination devices (e.g., pull-up termination devices) in accordance with embodiments.
Figure 9B:
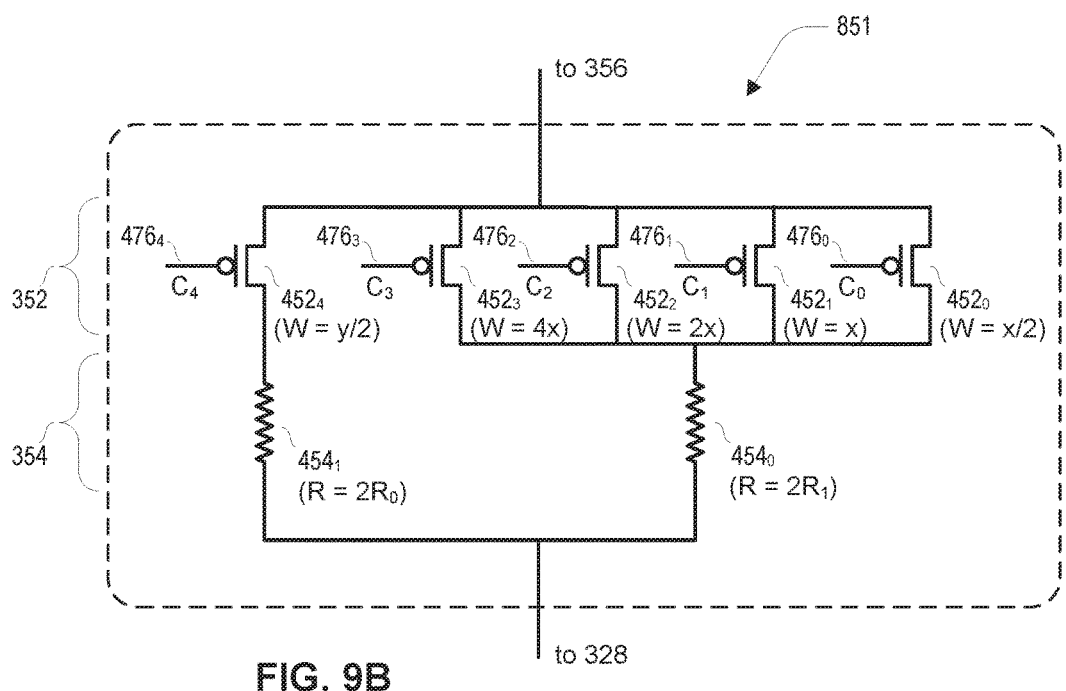

As depicted in FIGS. 9A and 9B, the pull-up termination devices 850 and the pull-up termination devices 851, respectively, of FIG. 8A may have the channel widths and resistance values of Tables 1 and 2. In this manner, the two half-strength pull-up termination devices 851 connected in parallel may collectively provide substantially the same (e.g., the same) resistance value as one pull-up termination device 850 when the same set of control signals are applied to their corresponding transistors 452, e.g., through their respective signals lines $476_0$-$476_4$. For example, providing control signals $C_0$-$C_4$ on respective signal lines $476_0$-$476_4$ of two pull-up termination devices 851 of the type depicted in FIG. 9B may collectively provide substantially the same (e.g., the same) resistance value as one pull-up termination device 850 of the type depicted in FIG. 9A receiving the same control signals $C_0$-$C_4$ on its respective signal lines $476_0$-$476_4$. Accordingly, an activated half-strength pull-up termination device 851 of the type depicted in FIG. 9B will individually provide a resistance value of two times a resistance value of an activated full-strength pull-up termination device 850 of the type depicted in FIG. 9A when they each receive the same set of control signals $C_0$-$C_4$ on their respective signal lines $476_0$-$476_4$.

Figure 8B:
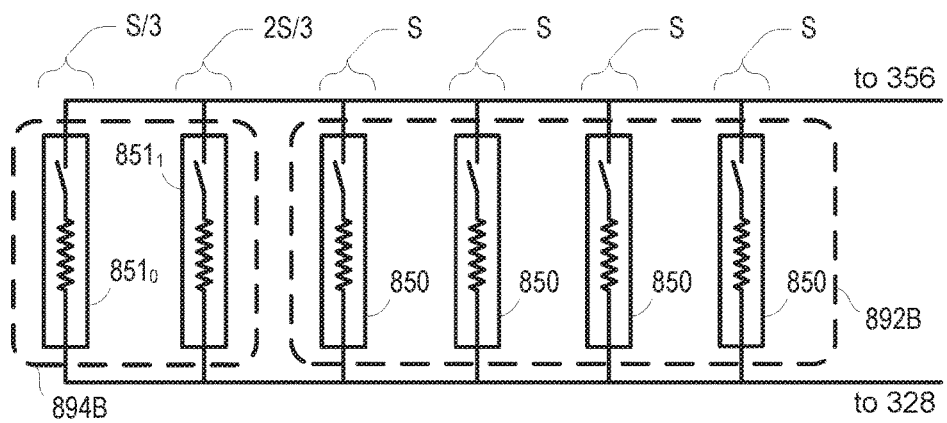

FIG. 8B is a simplified schematic of a unit driver (e.g., pull-up unit driver) 890B in accordance with an embodiment. Although the unit driver 890 is depicted to be a pull-up unit driver, the same concepts described with reference to FIG. 8B may be applied to a corresponding pull-down unit driver. The pull-up unit driver 890B is depicted to include a first group of termination devices 892B including one or more pull-up termination devices 850 (e.g., full strength pull-up termination devices 850) each having a strength of some value S. The pull-up unit driver 890B is depicted to further include a second group of termination devices 894B including one or more pull-up termination devices 851 (e.g., partial strength pull-up termination devices $851_0$ and $851_1$). The pull-up termination device $850_0$ is depicted to have a strength of one-third the value S. The pull-up termination device $850_1$ is depicted to have a strength of two-thirds the value S. The pull-up termination devices 851 and the pull-up termination devices 850 may have the same configuration of switchable resistances, i.e., they may each have the same configuration of switches and resistances.

Figure 9C:
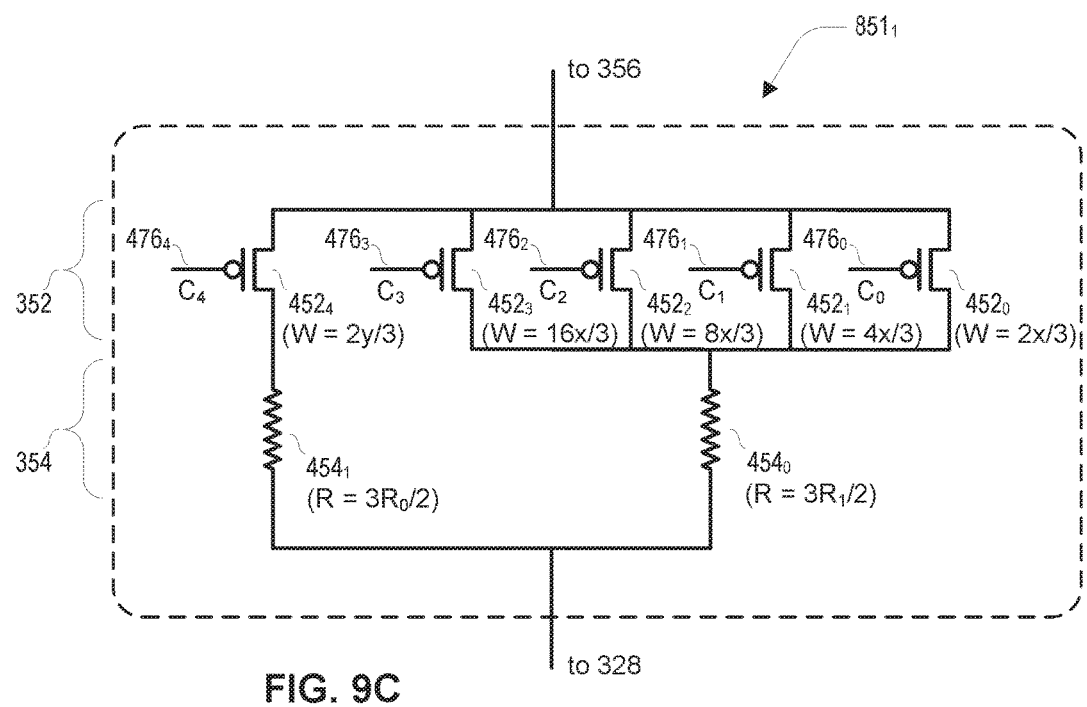
Figure 9D:
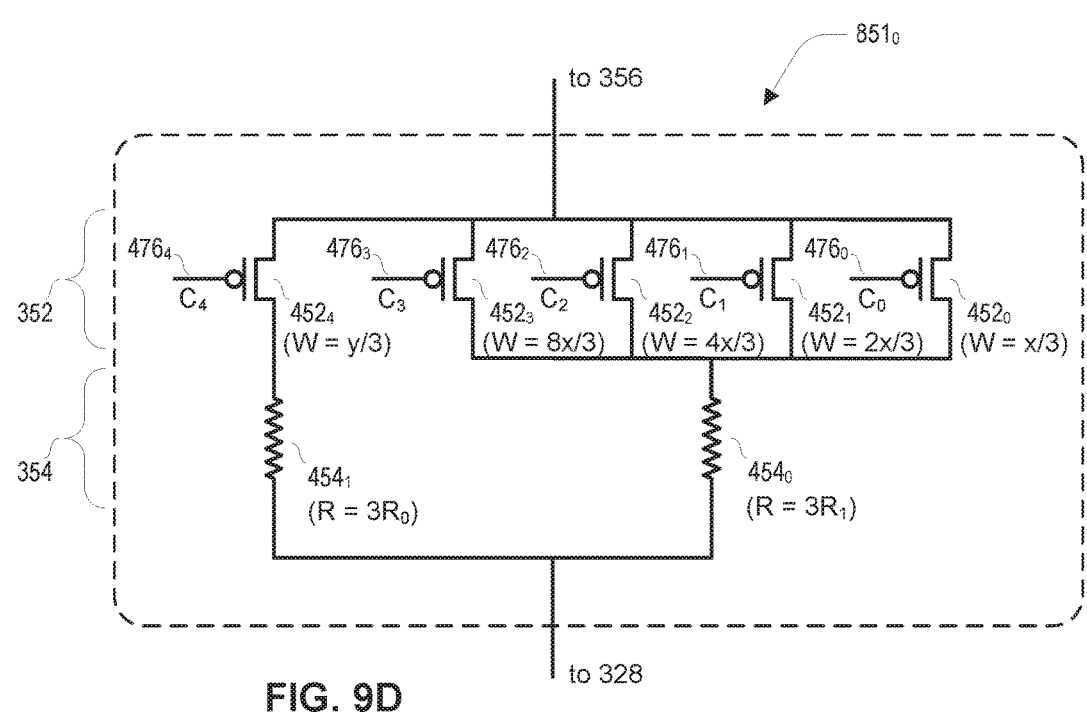

As depicted in FIG. 9A, the pull-up termination devices 850 of FIG. 8B may have the channel widths and resistance values of Tables 1 and 2. As depicted in FIG. 9C, the pull-up termination device $851_1$ of FIG. 8B may have channel widths of two-thirds the channel widths of the pull-up termination devices 850, and resistance values of one and a half times the resistance values of the pull-up termination devices 850, while, as depicted in FIG. 9D, the pull-up termination device $851_0$ of FIG. 8B may have channel widths of one-third the channel widths of the pull-up termination devices 850, and resistance values of three times the resistance values of the pull-up termination devices 850. In this manner, the two pull-up termination devices $851_0$ and $851_1$ could provide a ⅓ strength pull-up termination device through activation of the pull-up termination device $851_0$, could provide a ⅔ strength pull-up termination device through activation of the pull-up termination device $851_1$, or could provide a full strength pull-up termination device through activation of both pull-up termination devices $851_0$ and $851_1$.

Figure 8C:
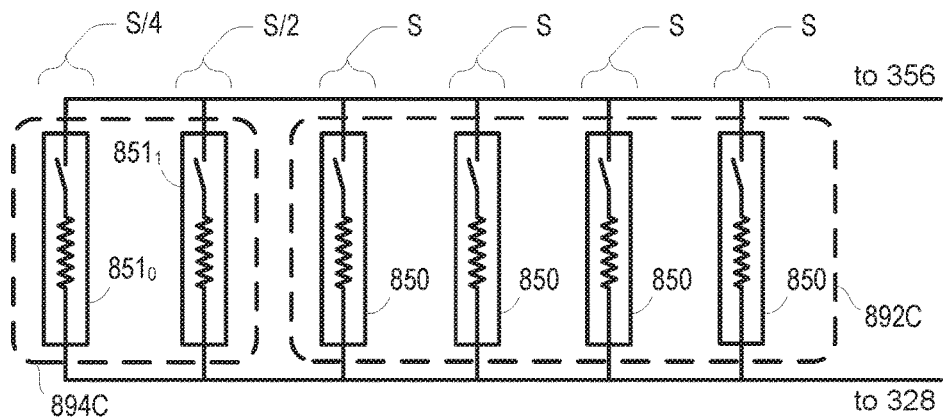

FIG. 8C is a simplified schematic of a unit driver (e.g., pull-up unit driver) 890C in accordance with an embodiment. Although the unit driver 890 is depicted to be a pull-up unit driver, the same concepts described with reference to FIG. 8C may be applied to a corresponding pull-down unit driver. The pull-up unit driver 890C is depicted to include a first group of termination devices 892C including one or more pull-up termination devices 850 (e.g., full strength pull-up termination devices 850) each having a strength of some value S. The pull-up unit driver 890C is depicted to further include a second group of termination devices 894C including one or more pull-up termination devices 851 (e.g., partial strength pull-up termination devices $851_0$ and $851_1$). The pull-up termination device $850_0$ is depicted to have a strength of one quarter the value S. The pull-up termination device $850_1$ is depicted to have a strength of one-half the value S. The pull-up termination devices 851 and the pull-up termination devices 850 may have the same configuration of switchable resistances, i.e., they may each have the same configuration of switches and resistances.

Figure 9E:
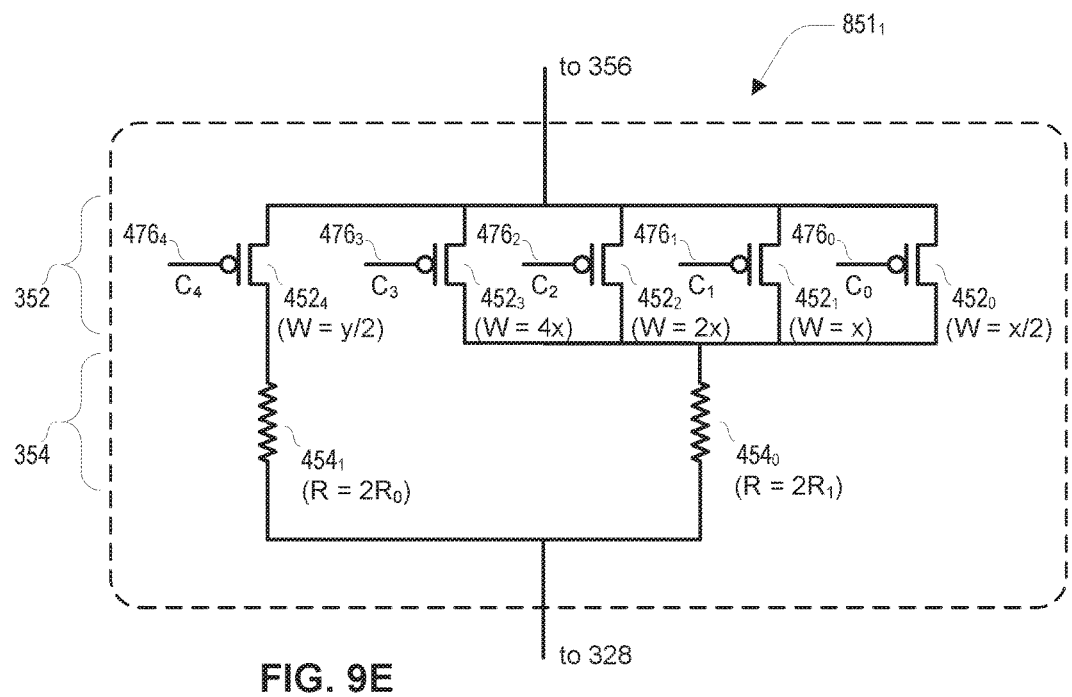
Figure 9F:
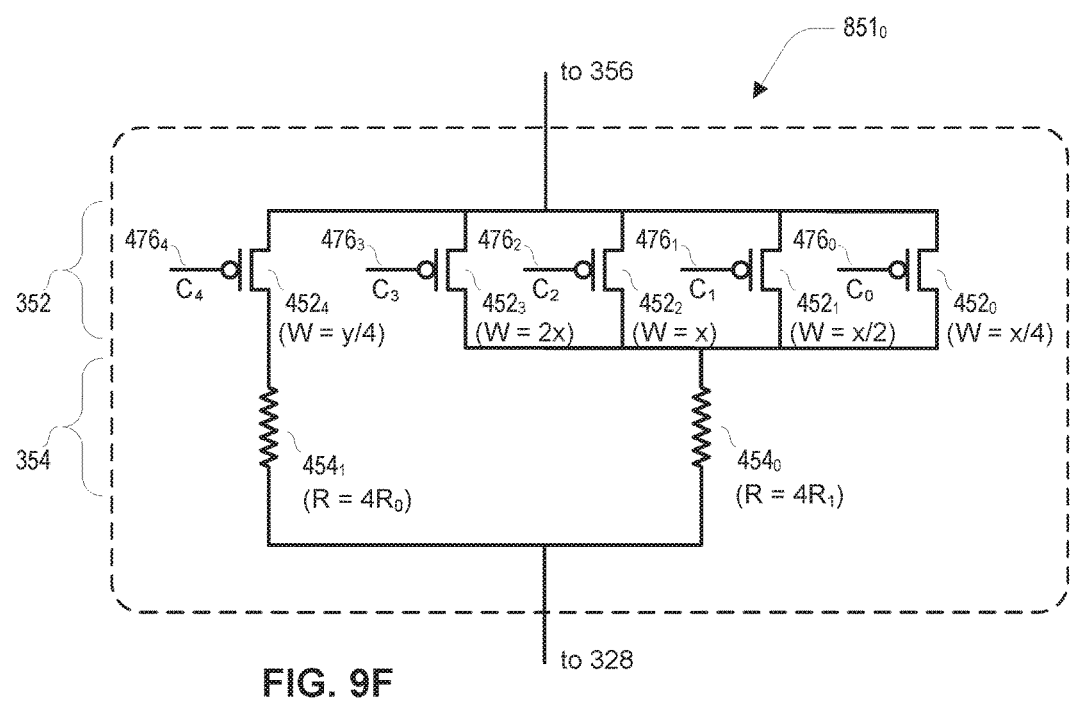

As depicted in FIGS. 9A and 9E, respectively, the pull-up termination devices 850 and the pull-up termination device $851_1$ of FIG. 8C may have the channel widths and resistance values of Tables 1 and 2, while, as depicted in FIG. 9F, the pull-up termination device $851_0$ of FIG. 8C may have channel widths of one-quarter the channel widths of the pull-up termination devices 850, and resistance values of four times the resistance values of the pull-up termination devices 850. In this manner, the two pull-up termination devices $851_0$ and $851_1$ could provide a ¼ strength pull-up termination device through activation of the pull-up termination device $851_0$, could provide a ½ strength pull-up termination device through activation of the pull-up termination device $851_1$, or could provide a ¾ strength pull-up termination device through activation of both pull-up termination devices $851_0$ and $851_1$.

Routine process variations should be considered when evaluating numerical values described herein. For example, industrial processes, and thus structures produced thereby, are not exact, and minor variations may occur. Thus, where a particular channel width or resistance value is described as being some multiple of another channel width or resistance value, respectively, variations within 10% of the expected value may be deemed to be the same as (e.g., equal to) the expected value.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating an apparatus, comprising:
    connecting a node of the apparatus to a first voltage node through a reference resistance and connecting the node to a second voltage node through a termination device of a signal driver circuit of the apparatus;
    comparing a voltage level at the node to a reference voltage, wherein the reference voltage has a voltage level different than half-way between a voltage level of the first voltage node and a voltage level of the second voltage node;
    when the comparing of the voltage level at the node to the reference voltage is deemed a match of the voltage level at the node and the reference voltage, storing particular settings of the termination device in response to deeming the match of the voltage level at the node and the reference voltage, wherein the particular settings of the termination device are selected from a group consisting of settings of the termination device used in producing the voltage level at the node deemed to match the reference voltage, and settings of the termination device used prior to the settings of the termination device used in producing the voltage level at the node deemed to match the reference voltage; and
    when the comparing of the voltage level at the node to the reference voltage is not deemed a match of the voltage level at the node and the reference voltage, adjusting a resistance value of the termination device.

2. The method of claim 1, wherein comparing the voltage level at the node to the reference voltage comprises the reference voltage having a voltage level that is closer to the voltage level of the first voltage node than the voltage level of the second voltage node.

3. The method of claim 1, wherein adjusting the resistance value of the termination device comprises decrementally adjusting the resistance value of the termination device.

4. The method of claim 3, wherein decrementally adjusting the resistance value of the termination device comprises decrementally adjusting the resistance value of the termination device from a highest adjustable value.

5. The method of claim 1, wherein comparing of the voltage level at the node to the reference voltage comprises applying the voltage level at the node to a first input of a voltage comparator and applying the reference voltage to a second input of the voltage comparator.

6. The method of claim 5, wherein comparing of the voltage level at the node to the reference voltage is deemed a match when a logic value of an output of the voltage comparator transitions.

7. The method of claim 1, wherein storing the settings of the termination device used prior to the settings of the termination device used in producing the voltage level at the node deemed to match the reference voltage comprises storing the settings of the termination device used immediately prior to the settings of the termination device used in producing the voltage level at the node deemed to match the reference voltage.

8. The method of claim 1, wherein the reference voltage has a value of (V1+V2)/2+ΔV, where V1 is the voltage level of the first voltage node, V2 is the voltage level of the second voltage node, and ΔV is some positive or negative voltage value having an absolute value exceeding a variability of V1 and V2.

9. The method of claim 8, wherein ΔV is selected to produce a match of the voltage level at the node and the reference voltage when the resistance value of the termination device has a desired resistance value.

10. The method of claim 9, wherein the selected ΔV satisfies Radj=Rref*(V2−V1−2ΔV)/(V2−V1+2ΔV) when V2>V1, where Radj is the desired resistance value of the termination device and Rref is the reference resistance.

11. An apparatus, comprising:
a data bus; and
a signal driver circuit comprising:
an output node connected to the data bus;
a voltage node;
a plurality of first termination devices and a plurality of second termination devices connected in parallel between the voltage node and the output node;
wherein each first termination device of the plurality of first termination devices and each second termination device of the plurality of second termination devices is configured to be deactivated in response to a respective plurality of control signals having a particular set of logic levels, and to be activated in response to its respective plurality of control signals having a set of logic levels other than the particular set of logic levels;
wherein each first termination device of the plurality of first termination devices is configured to exhibit a particular resistance when activated in response to its respective plurality of control signals having the set of logic levels other than the particular set of logic levels;
wherein each second termination device of the plurality of second termination devices is configured to exhibit a respective resistance greater than the particular resistance when activated in response to its respective plurality of control signals having the set of logic levels other than the particular set of logic levels; and
wherein a particular second termination device of the plurality of second termination devices is configured to exhibit a respective resistance that is a multiple of the particular resistance when activated in response to its respective plurality of control signals having the set of logic levels other than the particular set of logic levels.

12. The apparatus of claim 11, further comprising:
wherein each first termination device of the plurality of first termination devices is further configured to be activated in response to its respective plurality of control signals having any set of logic levels other than the particular set of logic levels; and
wherein each second termination device of the plurality of second termination devices is further configured to be activated in response to its respective plurality of control signals having any set of logic levels other than the particular set of logic levels.

13. The apparatus of claim 12, wherein, when all of the second termination devices of the plurality of second termination devices are activated in response to their respective pluralities of control signals having a same set of logic levels other than the particular set of logic levels, the plurality of second termination devices are configured to exhibit a collective resistance greater than or equal to a resistance of any first termination device of the plurality of first termination devices activated in response to its respective plurality of control signals having that same set of logic levels.

14. The apparatus of claim 13, wherein a particular second termination device of the plurality of second termination devices is configured to exhibit a resistance greater than a resistance of a different second termination device of the plurality of second termination devices when both the particular second termination device and the different second termination device are activated in response to their respective pluralities of control signals having that same set of logic levels.

15. The apparatus of claim 11, wherein each second termination device of the plurality of second termination devices is configured to exhibit a same resistance when activated in response to its respective plurality of control signals having the set of logic levels other than the particular set of logic levels.

16. The apparatus of claim 11, wherein the respective pluralities of control signals of each of the first termination devices of the plurality of first termination devices each have a particular number of control signals, and wherein the respective pluralities of control signals of each of the second termination devices of the plurality of second termination devices each have the particular number of control signals.

17. The apparatus of claim 11, wherein each first termination device of the plurality of first termination devices has a particular configuration of switchable resistances between the voltage node and the output node, and wherein each second termination device of the plurality of second termination devices has the particular configuration of switchable resistances between the voltage node and the output node.

18. The apparatus of claim 17, wherein each switchable resistance of the particular configuration of switchable resistances comprises a switch and a resistance connected in series.

19. The apparatus of claim 18, wherein at least one switchable resistance of the particular configuration of switchable resistances comprises a plurality of switches connected in parallel with each other and connected in series with a resistance.

20. The apparatus of claim 18, wherein each switch comprises a transistor, and wherein each resistance comprises a resistor.

21. The apparatus of claim 18, wherein the particular configuration of switchable resistances comprises a plurality of transistors and a plurality of resistances, and wherein each switch comprises a transistor.

22. The apparatus of claim 18, wherein channel widths of the transistors of the particular configuration of switchable resistances of a particular second termination device of the plurality of second termination devices are each a particular fraction of channel widths of their corresponding transistors of the particular configuration of switchable resistances of any first termination device of the plurality of first termination devices.

23. The apparatus of claim 22, wherein resistance values of the resistances of the particular configuration of switchable resistances of the particular second termination device are each a particular multiple of resistance values of their corresponding resistances of the particular configuration of switchable resistances of any first termination device of the plurality of first termination devices.

24. The apparatus of claim 23, wherein the particular multiple is an inverse of the particular fraction.

25. The apparatus of claim 23, wherein channel widths of the transistors of the particular configuration of switchable resistances of a different second termination device of the plurality of second termination devices are each a different fraction of channel widths of their corresponding transistors of the particular configuration of switchable resistances of any first termination device of the plurality of first termination devices.

26. The apparatus of claim 25, wherein resistance values of the resistances of the particular configuration of switchable resistances of the different second termination device are each a different multiple of resistance values of their corresponding resistances of the particular configuration of switchable resistances of any first termination device of the plurality of first termination devices.

27. The apparatus of claim 26, wherein the different multiple is an inverse of the different fraction.

28. An apparatus, comprising:
 a data bus; and
 a signal driver circuit comprising:
  an output node connected to the data bus;
  a voltage node;
  a plurality of first termination devices and a plurality of second termination devices connected in parallel between the voltage node and the output node and each having a particular configuration of switchable resistances;
  wherein each first termination device of the plurality of first termination devices and each second termination device of the plurality of second termination devices is configured to be deactivated in response to a respective plurality of control signals having a particular set of logic levels, and to be activated in response to its respective plurality of control signals having a set of logic levels other than the particular set of logic levels;
 wherein each control signal of each of the pluralities of control signals is configured to selectively activate a respective switch of the particular configuration of switchable resistances for its respective termination device;
 wherein each first termination device of the plurality of first termination devices is configured to exhibit a particular resistance when activated in response to its respective plurality of control signals having the set of logic levels other than the particular set of logic levels;
 wherein each second termination device of the plurality of second termination devices is configured to exhibit a respective resistance greater than the particular resistance when activated in response to its respective plurality of control signals having the set of logic levels other than the particular set of logic levels; and
 wherein a value of a resistance of the particular configuration of switchable resistances of a particular second termination device of the plurality of second termination devices is a multiple of a value of a corresponding resistance of the particular configuration of switchable resistances of each first termination device of the plurality of first termination devices.

* * * * *